United States Patent [19]
Gatti

[11] Patent Number: 5,568,087
[45] Date of Patent: Oct. 22, 1996

[54] PRE-DISTORTING LINEARIZATION CIRCUIT

[75] Inventor: Giuliano Gatti, Wassenaar, Netherlands

[73] Assignee: Agence Spatiale Europeenne, Paris, France

[21] Appl. No.: 489,223

[22] Filed: Jun. 12, 1995

[30] Foreign Application Priority Data

Jun. 13, 1994 [FR] France .................................. 94 07179

[51] Int. Cl.$^6$ .................. H03F 1/32; H03F 3/16
[52] U.S. Cl. .................... 330/149; 330/295; 330/277
[58] Field of Search .................... 330/149, 277, 330/286, 295, 302

[56] References Cited

U.S. PATENT DOCUMENTS 4,564,816  1/1986  Kumar et al. ........................... 330/149
5,291,148  3/1994  Reisner et al. ......................... 330/149

OTHER PUBLICATIONS

M. Kumar et al., "GaAs Dual–Gate FET Linearizer for Traveling–Wave Tube Amplifiers", *Microwave Journal*, vol. 27, No. 8, Aug. 1984, pp. 127–134.

N. Imai, "A 10 GHz MMIC Predistortion Linearizer Fabricated on a Single Chip", *Transactions of the Institute of Electronics and Communication*, vol. E76–C, No. 12, Dec. 1993, pp. 1847–1850.

*Primary Examiner*—Steven Mottola
*Attorney, Agent, or Firm*—Bell, Seltzer, Park & Gibson

[57] ABSTRACT

The invention concerns a pre-distorting linearization circuit, comprising a splitter circuit with an input forming the input of the linearization circuit and first and second outputs feeding first and second parallel stages respectively, of which at least one has a defined distortion characteristic, and a combining circuit receiving the signals provided by the first and second stages at first and second inputs respectively and having a recombination output. According to the invention, the first and second stages have first and second transistors respectively having different dimensions, which confer different non-linearity characteristics thereon, such that for the same voltage on the input of the linearization circuit, the first stage exhibits a higher degree of non-linearity than the second stage.

10 Claims, 7 Drawing Sheets

PRE-DISTORTING LINEARIZATION CIRCUIT

FIELD OF THE INVENTION

The present invention concerns a pre-distorting linearization circuit, comprising a splitter circuit with an input forming the input of the linearization circuit and first and second outputs feeding first and second parallel stages respectively, of which at least one has a defined distortion characteristic, and a combining circuit receiving the signals provided by the first and second stages at first and second inputs respectively and having a recombination output which forms the output of the linearization circuit.

BACKGROUND OF THE INVENTION

Such a circuit, which is known as a circuit with a bridge configuration, provides great flexibility and avoids operating the circuit in conditions of high distortion.

One simple bridge circuit thus splits the signal into two components having a phase difference therebetween of 90° or 180°, using a power divider. One of the signals is then treated by a linear branch forming the first stage and the other signal by a non-linear circuit forming the second stage. The phase and amplitude of the signal are not altered in the linear branch. However, the phase and amplitude are modified in the non-linear branch. The two signals are then combined with suitable amplitude and phase, obtained with an attenuator and a phase shifter for example, in a combining circuit which is in general of the same type as the circuit used to split the input signal. The result of this treatment is that the signal presented to the input of the linearization circuit can have gain expansion and a delay, or even an advance, which can be made complementary to those of the transmitter which is to be linearized.

Such a pre-distorting linearization circuit can be used in particular for satellite transmissions involving a plurality of carriers. It is an object of the invention to allow the power amplifiers used for this transmission to operate closer to their saturation characteristics, which improves their efficiency and thus their functionality. Such a consideration is equally applicable to transmitters for amplifying signals with a non-constant envelope, for example with filtered QPSK modulation, i.e. quadrature modulation with phase shift.

Pre-distorting linearization circuits are used in preference to linearization circuits of other types because of their efficiency, their simplicity, and their low losses, and also because they do not introduce attenuation into the output signal.

A pre-distorting linearization circuit can also be useful in distributed antenna systems (array, multi-port systems, etc.) in order to increase linearity and at the same time reduce the phase and gain tracking demands between the different amplifier units.

A pre-distorting linearization circuit is generally located between the amplifier of the corresponding channel and the traveling wave tube amplifier, or is even integrated directly into an integrated power amplifier, to form an amplifier module. Its function is to provide amplitude and phase characteristics which complement those of the transmitter, so as to compensate for distortion.

The end result which can be achieved with this linearization is that the transmitter can be operated very close to its saturation region while preserving satisfactory nominal linearity.

Known types of linearization circuits which are in the form of a bridge generally have a linear branch formed by a simple connection, by a phase shifter and/or by a variable attenuator or even an amplifier. The non-linear branch is implemented by a component which introduces distortion, such as a PIN or Schottky diode or even MESFET type field effect transistors with a single or double gate.

One of the important parameters of linearization circuits is the amplitude ratio of the bridge, i.e. the ratio between the two output signals of the two branches. Ideally this ratio should be as close as possible to 0 dB.

OBJECTS AND SUMMARY OF THE INVENTION

The present invention concerns a pre-distorting linearization circuit which is to be simple in its architecture and allow an amplitude ratio of the bridge to be maintained easily, without introducing attenuation of the signal.

The concept is based on making use of the characteristics of transistors in the two branches in such a manner that they impart different non-linearity properties. In particular the invention relies on the possibility of implementing different sizes of MESFET type transistors in microwave monolithic integrated circuits (MMICs).

In the linearization circuit of the invention the first and second stages thus have first and second transistors respectively having different dimensions, which confer different non-linearity characteristics thereon, such that for the same voltage on the input of the linearization circuit, the first stage exhibits a higher degree of non-linearity than the second stage.

In a preferred embodiment, the first and second transistors are field effect transistors, in particular of MESFET type, having first and second gates respectively, whose widths are in a given ratio other than unity; this ratio may for example lie in the range 2 to 10 and is preferably equal to 4. Each of said MESFETs advantageously has separate gate bias and drain bias terminals, thereby enabling their distortion characteristics to be adjusted more finely.

It is an advantage if the splitter circuit and the combining circuit have a nominal impedance of 100 Ω. To this end, the splitter circuit and the combining circuit can have a series branch comprising in succession a first, a second, and a third capacitor in series, forming an output branch for the splitter circuit and an input branch for the combining circuit, a first inductor having a first terminal connected to a first terminal of the second capacitor, a second inductor having a first terminal connected to a second terminal of the second capacitor, a fourth capacitor connected between the second terminals of the first and the second inductor and a resistor connected between the second terminal of the second inductor and a voltage supply terminal, Generally ground, the second terminal of the first inductor forming an input terminal for the splitter circuit and an output terminal for the combining circuit.

The first stage can have a phase shift component, for example a delay line. The splitter circuit, the combining circuit and the first and second stages are preferably on a first substrate of MMIC technology, while the delay line is on a second substrate of MIC technology (microwave integrated circuit).

BRIEF DESCRIPTION OF THE DRAWINGS

The invention will be better understood from a reading of the following description, Given by way of non-limiting example with reference to the accompanying drawings, in which:

FIG. 2 is an illustration of the operation of the linearization circuit of FIG. 1;

MORE DETAILED DESCRIPTION

Figures 1, 2A, 2B:
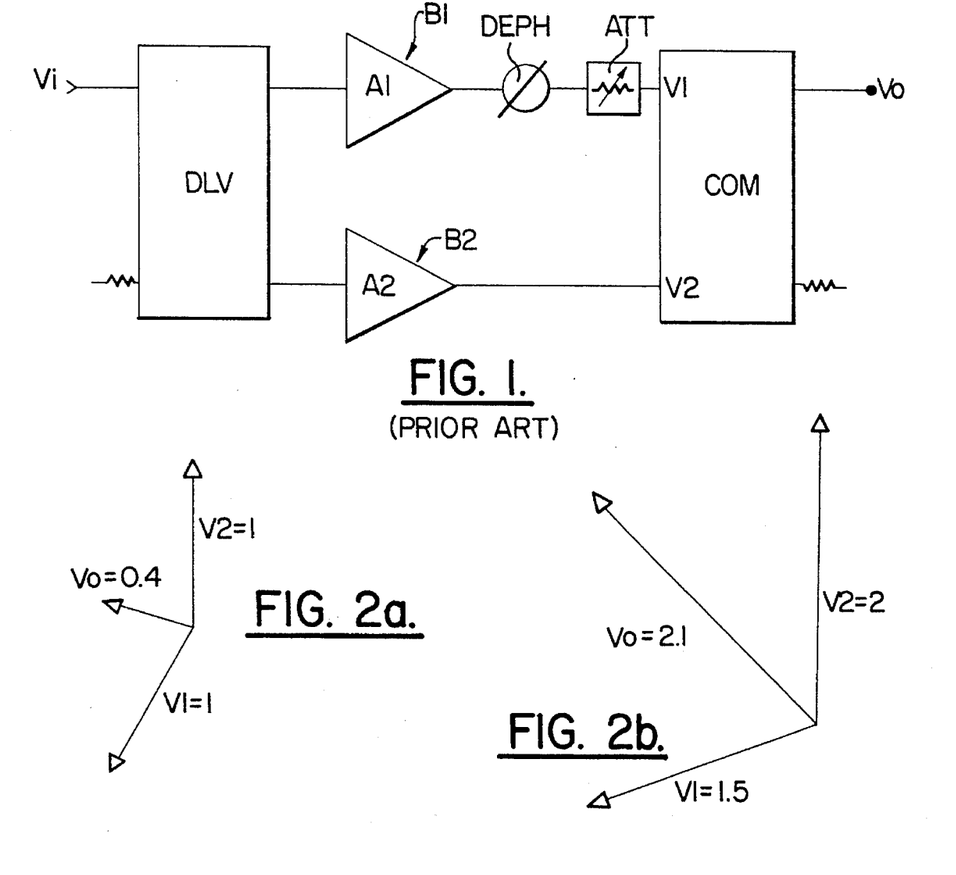
FIG. 1 is a block diagram of a pre-distorting linearization circuit of bridge type with two branches of the prior art.

The pre-distorting linearization circuit of the prior art shown in FIG. 1 is of simple bridge type. In this the input signal V1 is split by a splitter circuit DIV into two signals with a phase difference of 90° or 180° between them. One of these signals is treated by a stage forming a first branch B1, which is a non-linear branch, while the other signal is treated by a second stage forming a second branch B2, which is a linear branch, i.e. a branch in which the amplitude and the phase of the signal are not modified. In the non-linear branch B1 the amplitude and the phase of the signal are modified, after which the two output signals of the two branches, denoted V1 and V2, are fed with the required amplitude and phase into a combining circuit COM, which is in general the same as the splitter circuit DIV, but operating with the inputs and outputs reversed. It is noted that the first branch B1 comprises a phase shift circuit DEPH (and possibly an attenuator ATT), which allows the desired amplitude and phase of the signal V1 to be obtained. The output signal V0 of the predistorting linearization circuit which will be applied to the input of the transmitter has gain and phase characteristics which are complementary to those of the transmitter, so as to compensate for its distortion.

This compensation for distortion is illustrated in FIG. 2, in which the vector V2 has its amplitude multiplied by 2 at the output of the linear branch B2, while the vector V1 at the output of the non-linear branch B1 is subjected to a phase advance of 30°, for example, and has its amplitude multiplied by a factor less than 2, for example 1.5, because of the compression of the corresponding level by its non-linear characteristic. If the phase and amplitude of the signals V1 and V2 are correctly adjusted, the vector representing the output signal V0 of the bridge circuit has an increase in amplitude (expansion of level) as well as a phase advance. It is important to note that, for efficient linearization, the amplitudes of the linear vector and the non-linear vector at the outputs of the linear and non-linear branches, i.e. the signals V1 and V2, should be similar, as has been mentioned above. The amplitude ratio between the two signals, normally called the amplitude ratio of the bridge, generally lies in the range 0 dB to −4 dB.

Figure 3:
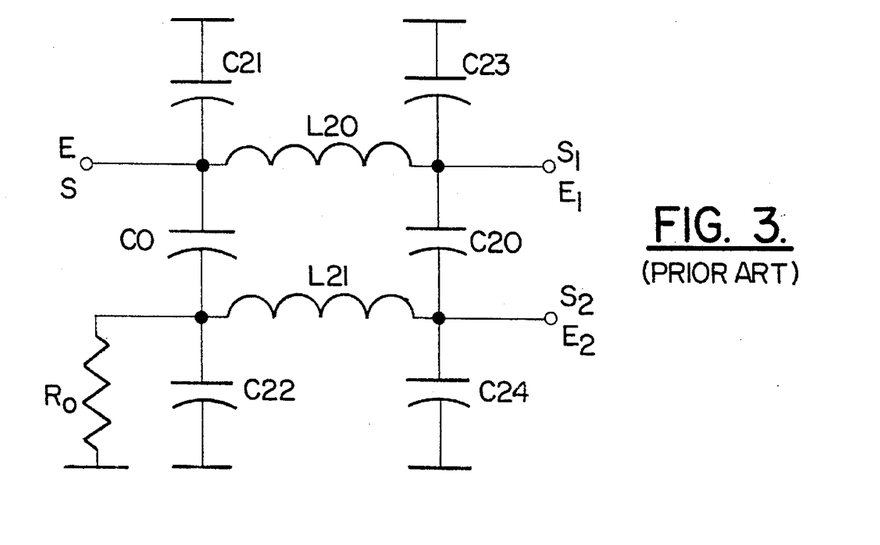
FIG. 3 is a block diagram of a splitter circuit or a combining circuit with a nominal impedance of 50 Ω of the prior art.
Figure 4:
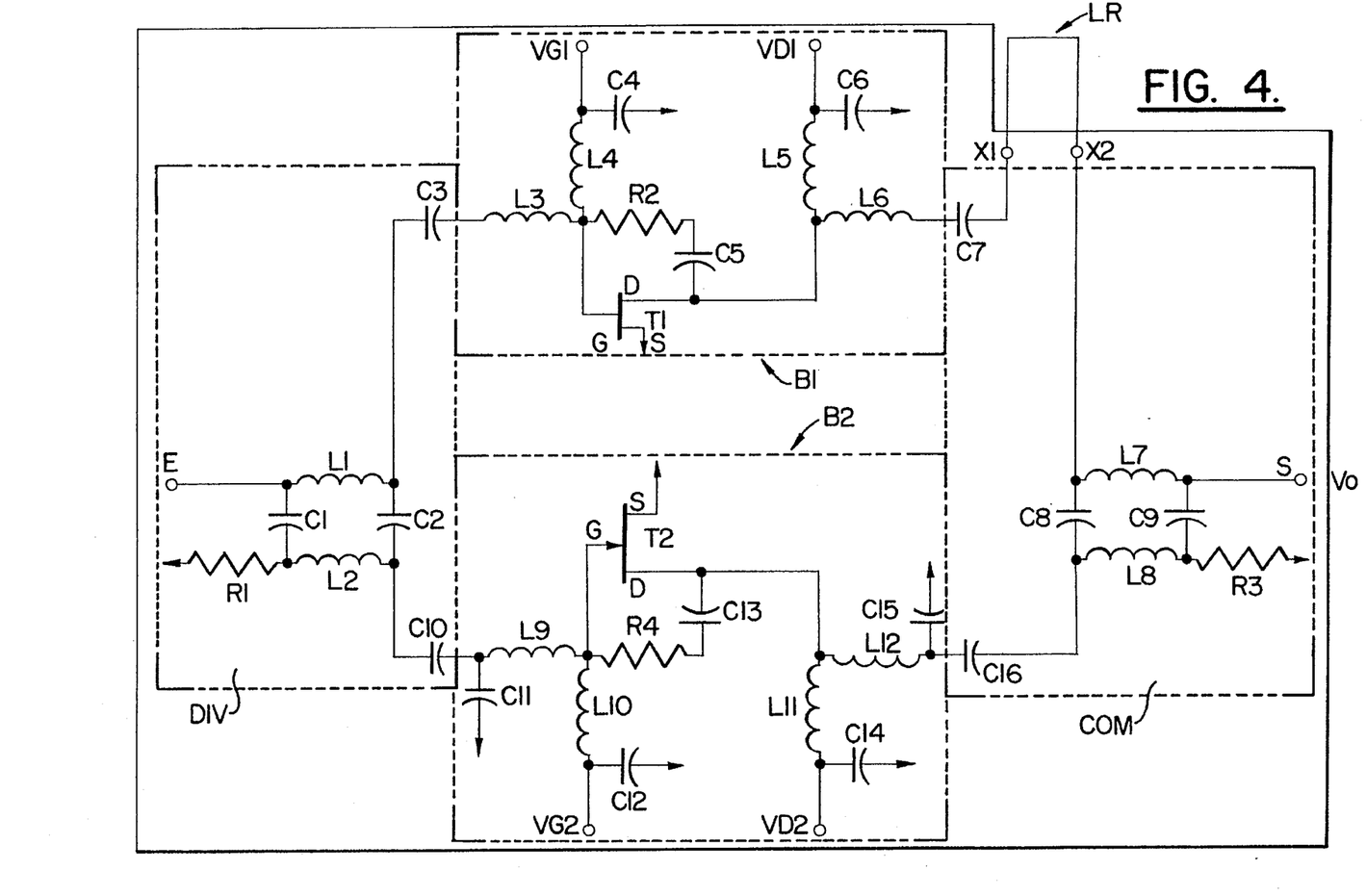
FIG. 4 shows a preferred embodiment of a predistorting linearization circuit of the present invention.

Referring to FIG. 4, the linearization circuit of the invention is of the general type shown in FIG. 1, comprising a splitter circuit DIV and a combining circuit COM, which can be of the known type shown in FIG. 3 or equally, as is shown in the course of the description, of the type shown that corresponds to a nominal impedance of 100 Ω.

The two branches B1 and B2 comprise field effect transistors of MESFET type, T1 and T2 respectively, connected as source followers. The gates G of the transistors T1 and T2 are connected to the respective outputs of the splitter circuit DIV through respective series inductors L3 and L9 and their drains D are connected to the respective inputs of the combining circuit COM through respective inductors L6 and L12. Each of the transistors T1 and T2 has a gate bias circuit, namely with a series inductor L4 and a shunt capacitor C4 to ground for an adjustable gate voltage terminal VG1 for the branch B1, and a series inductor L10 and a shunt capacitor C12 for an adjustable gate bias voltage terminal VG2 for the branch B2. Likewise, in order to bias the drains of the transistors T1 and T2, there is a similar arrangement, namely an inductor L5 and a capacitor C6 for an adjustable drain voltage terminal VD1 for the transistor T1 in the branch B1 and an inductor L11 and a capacitor C14 for an adjustable drain voltage terminal VD2 for the transistor T2 in the branch B2. In addition, a resistor and a capacitor in series provide drain-gate feedback, namely R2 and C5 for the transistor T1 and R4 and C13 for the transistor T2.

The transistors T1 and T2 are MESFETs with different gate widths, this gate width being smaller for the transistor T1 in the non-linear branch B1.

The invention uses one of the possibilities allowed by MMIC technology, namely dimensioning individual components (transistors, inductors, capacitors, resistors, etc.).

In the case of the MESFETs, this dimensioning is effected by determining the gate width $G_W$. In the case of a MESFET, the output power P0 is directly related to the gate width $G_W$ (expressed in mm) by the linear equation:

$$P_O = K G_W$$

The constant K (in W/mm) is the power density and its value is a characteristic of the MMIC technique employed, and the value of K varies little as a function of the frequency of operation. The value of K is substantially equal to 0.5 W/mm for power MMIC methods around 10 GHz and is in the order of 0.2 W/mm or even less for low noise methods or general usage.

In the pre-distortion bridge circuit of the invention, transistors T1 and T2 of different sizes are implemented in the branches B1 and B2 so that a transistor T1 of small size in the non-linear branch B1 and a transistor T2 of greater size in the linear branch B2 make it possible for the transistor T1 to operate in a non-linear range, while the transistor T2 of greater size operates in its linear region, for a certain range of input power values. A transistor is considered by definition to be in its linear region when its departure from linearity corresponds to compression of less than a given relative value, 1 dB for example.

If for example the transistor T1 has a gate width G1 four times smaller than the gate width G2 of the transistor T2, it exhibits in its output power characteristic an output power with 1 dB compression, which will be approximately 6 dB lower than that of the transistor T2.

The more the ratio between the gates widths is increased, the greater the input power range over which the linearization circuit is able to provide compensation, but it also results in the circuit consuming more continuous power. This input power range in which compensation is possible is limited by the compression characteristics of the transistor T2 and by the maximum allowable input power for the transistor T1 compatible with reliable operation thereof.

In practice the ratio $G_2/G_1$ lies in the range 2 to 10 and the preferred value is 4.

It is noted that the presence of a MESFET in each of the two branches of the bridge also provides another important advantage. Thus, these transistors provide gain in each of the branches, which keeps the amplitude ratio of the bridge at a value close to 0 dB, which allows maximum linearization efficiency. It is noted that this is not the case for example in prior art bridges in which passive components, such as PIN diodes, are used to introduce the distortion. When the branch introducing distortion also produces attenuation, this attenuation has also to be introduced into the linear branch, so as to obtain the best linearization efficiency, which results in needless increase in the losses in the linearization circuit.

An important feature of the linearization circuit is the selection of the network forming the splitter circuit and the combining circuit. This can be a conventional network with a nominal impedance of 50 Ω, such as is shown in FIG. 3, which has two branches, each with three capacitors in series, namely C21, C0, C22 for the first branch and C23, C20 and C24 for the second branch. An inductor L20 is connected between the terminal common to the capacitors C21 and C0 and the terminal common to C23 and C20. An inductor L21 is connected between the terminal common to the capacitors C0 and C22 and the terminal common to C20 and C24. Furthermore, a resistor R0 is connected between the terminal common to the capacitors C0 and C22 and ground. The terminal common to the capacitors C21 and C0 forms the input E in the case of a splitter circuit DIV and the output S in the case of a combining circuit COM. The terminal common to the capacitors C23 and C20 forms a first output S1 in the case of a splitter circuit DIV and a first input E1 in the case of a combining circuit COM. Likewise the terminal common to the capacitors C20 and C24 forms a second output $S_2$ in the case of a splitter circuit DIV and a second input $E_2$ in the case of a combining circuit COM.

By way of example, we have:
C21= C22= C23= C24= 0.1 pF.
C0=C20=2C21
L20=L21= 0.45 nH In a preferred embodiment of the present invention, which is shown in FIG. 4, the splitter circuit DIV and the combining circuit COM have a nominal impedance of 100 Ω. This allows the number of capacitors required to be halved. Furthermore, the capacitors next to the dual output port of the circuit DIV or the dual input port of the circuit COM can be buried under the coupling networks of the linear and non-linear amplifiers, which enables the area of gallium arsenide occupied by the integrated circuit MMIC to be reduced.

As shown in FIG. 4, the splitter circuit DIV has an input terminal E which is the point common to an inductor L1 and a capacitor C1. The other terminal of the capacitor C1 is connected firstly to a first terminal of a resistor R1 with a value of 50 Ω, the other terminal of which is grounded, and secondly to a first terminal of the inductor L2. The capacitor C2 is connected between the second terminals of the inductors L1 and L2. Capacitors C3 and C10 are connected, the former between the second terminal of the inductor L1 and the inductor L3 and the latter between the second terminal of the inductor L2 and the inductor L9. The combining circuit COM is formed in the same way, the capacitors C1, C2, C3 and C10 being replaced by the capacitors C9, C8, C7 and C16 respectively, the inductors L1 and L2 by the inductors L7 and L8 respectively and the resistor R1 by the resistor R3.

It is also noted that the circuit has two terminals X1 and X2 for connection to an external delay line LR, these terminals being interposed between the capacitors C7 and C8.

By way of example, we have:
C3=C2=C6=C7=C8=C16=0.125 pF
C1=C9=0.25 pF
L1=L2=L7=L8=0.63 nH
R1=R2=50 Ω.

Figure 5:
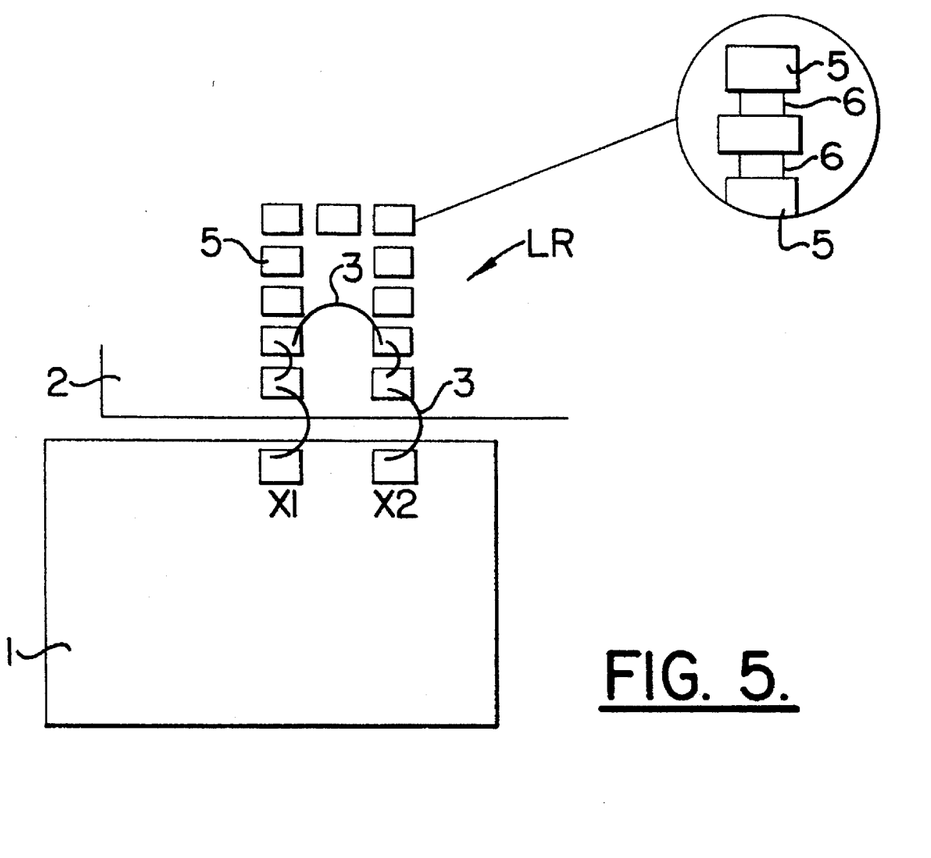
FIG. 5 shows a variant of the circuit of FIG. 4 implemented on two substrates.
Figure 5A:
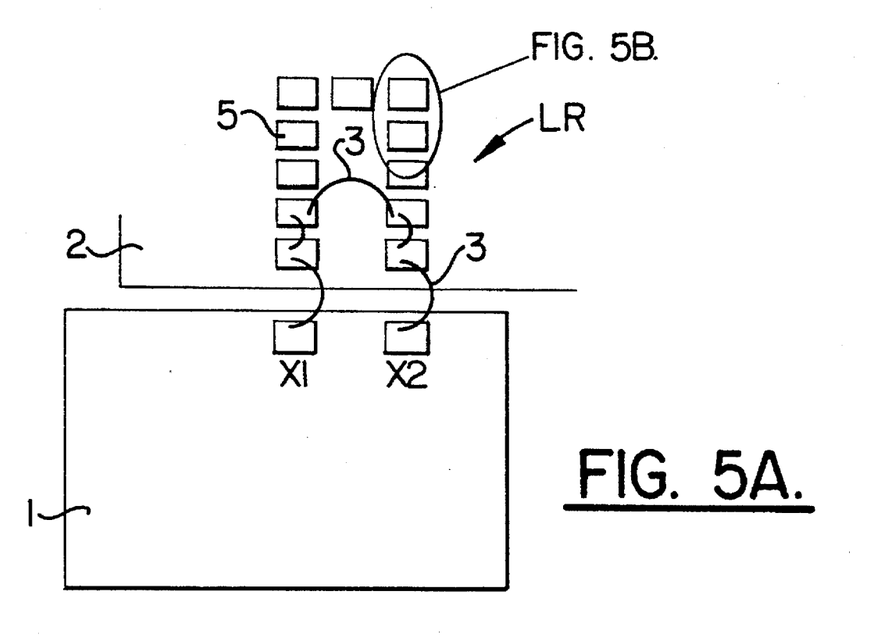
Figure 5B:
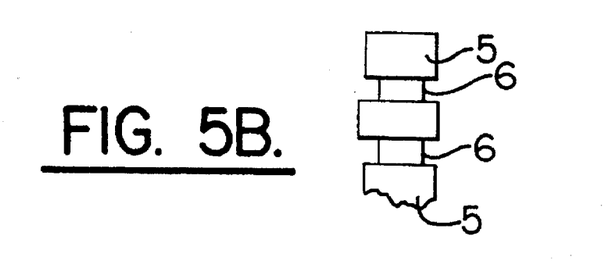

According to the invention, the phase is set in the non-linear branch B1 by means of a delay line LR with a nominal impedance of 100 Ω corresponding to that of the circuits DIV and COM. In order to be able to match different required linearization characteristics, the delay line LR is preferably disposed not on the MMIC chip containing the linearization circuit proper but outside it on an alumina substrate 2 which is used for assembling the chip 1 to form a module. This is shown in FIG. 5. The length of the line is modified by altering the number of unit connecting terminals 5 which are connected in series by conductive links 3.

It is noted that, in order to obtain a less pronounced linearization action, the delay line LR can be designed to allow attenuation of the amplitude of the non-linear vector V1 and hence an increase in the amplitude ratio of the bridge. This attenuation can be obtained using thin film resistors 6 between the terminals of the elementary connecting terminals 5 for example, as is shown ringed in FIG. 5.

The use of a delay line LR makes it possible to avoid an increase in the complexity of the bridge involved in use of a conventional phase shifter.

The present invention can be implemented in particular to provide a pre-distorting linearization circuit in MMIC technology implemented using the LN-5 process of THOMSON. This process is a MESFET process having a characteristic gate length of 0.5 μ.

The transistor T2 has four fingers each of which has a length of 150 μ for a total gate width of 600 μ. The small transistor T1 has two fingers of length 75 μ for a total gate width of 150 μ. Distortion is thus obtained in the linear branch which is equal to that of the non-linear branch over a power range which is 6 dB above that of the non-linear branch. The gain in each of the branches is in the order of 6 dB, which keeps the bridge ratio in the region of 0 dB for maximum linearization efficiency and reduction of the total insertion losses of the linearization circuit. The total power consumption is in the order of 225 mW.

FIGS. 6a to 6e show the gain and phase shift of the linearization circuit for input powers ranging from 0 dBm to 15 dBm and for increasing values of delay created by the delay line LR.

Figure 6A:
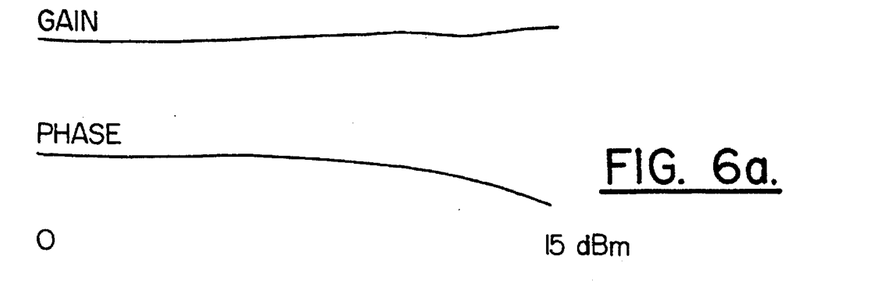
FIGS. 6a, 6b, 6c, 6d and 6e represent the non-linearity characteristics of the circuit of FIG. 4 as a function of different adjustments of the delay line corresponding to phase shifts of respectively 0° (reference), 10°, 20°, 30° and 40°.
Figure 6B:
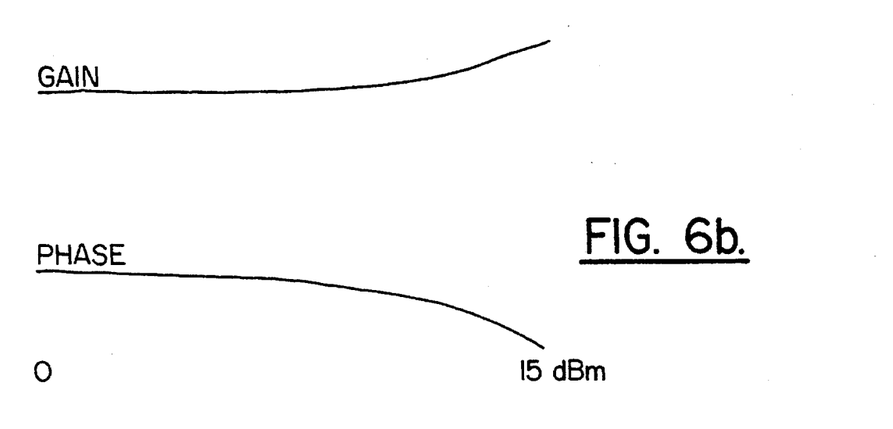
Figure 6C:
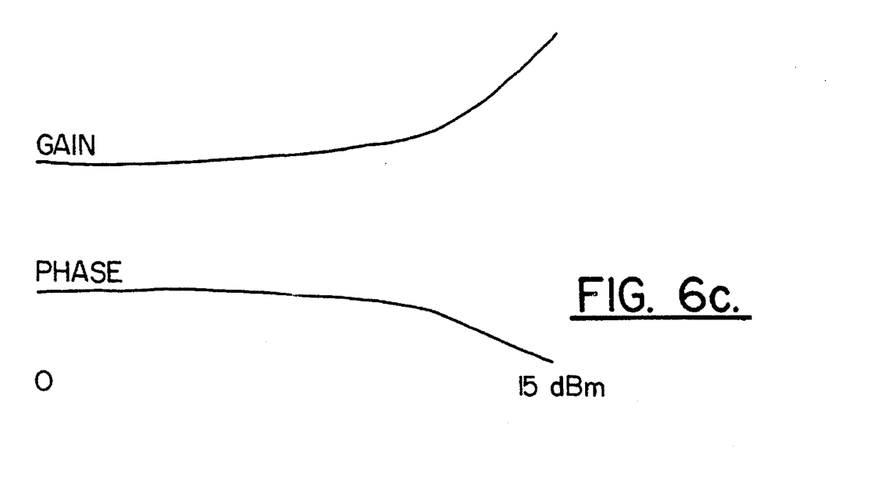
Figure 6D:
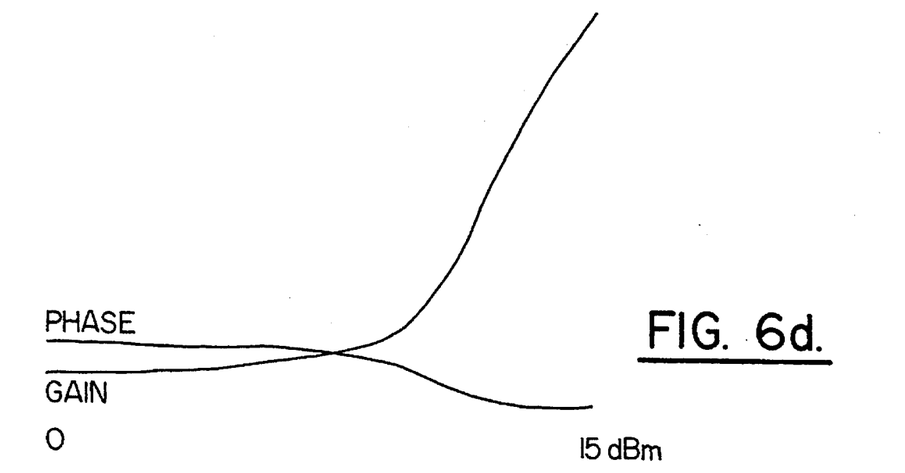
Figure 7:
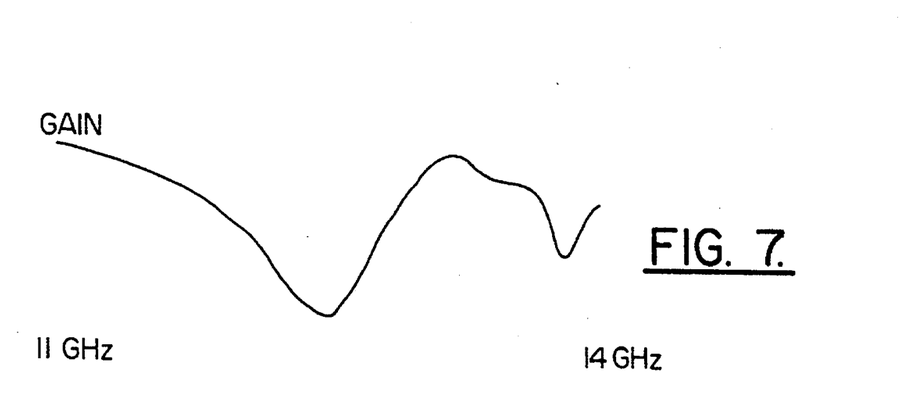
FIG. 7 shows the characteristics of the response curves for the "small signal" mode between 11 GHz and 14 GHz corresponding to the case of FIG. 6d.

FIG. 7 shows the response curve for small signals ranging from 11 GHz to 14 GHz corresponding to FIG. 6d, i.e. to the case in which the maximum expansion of gain is obtained. This corresponds to the case in which the vectors in the linear branch V1 and the non-linear branch V2 have approximately the same amplitudes but a phase difference of 180°. This produces a drop of around 15 dB in the response curve as is shown in FIG. 7.

Figure 6E:
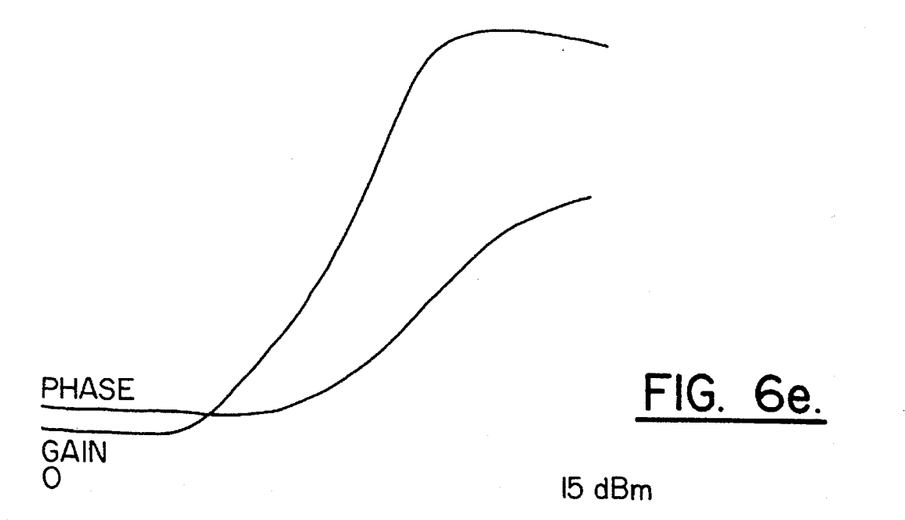

FIG. 6e shows a configuration in which the expansion in gain is in the order of 11 dB with a phase advance of approximately 50°.

The configuration shown in FIG. 4 allows the Gates and the drains of the transistors T1 and T2 to be separately biased. This allows supplementary adjustments of the linearization circuit. Obviously, if such adjustments are not required, the transistors T1 and T2 can be biased by predetermined, fixed bias voltages.

Figure 8A:
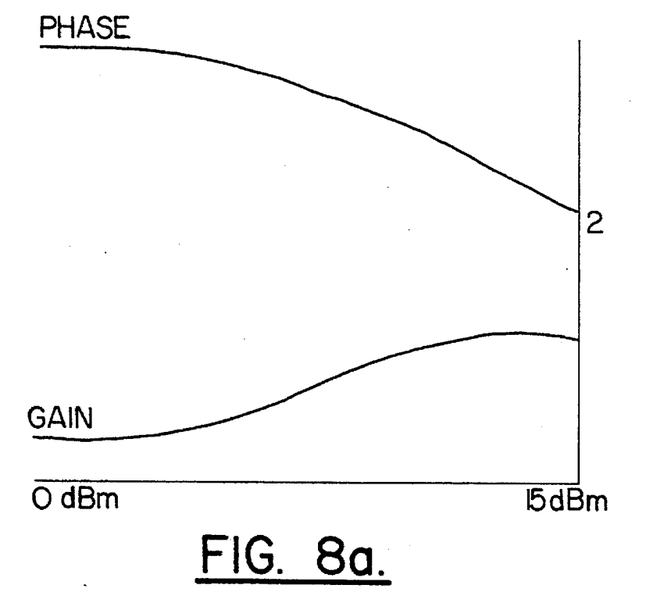
FIGS. 8a and 8b are curves showing the adjustments possible for two values of the gate and drain voltages of the circuit of FIG. 4, these values lying between 1.5 V and 3.5 V for VD1 and VD2 and between −0.5 V and −1.5 V for VG1 and VG2.
Figure 8B:
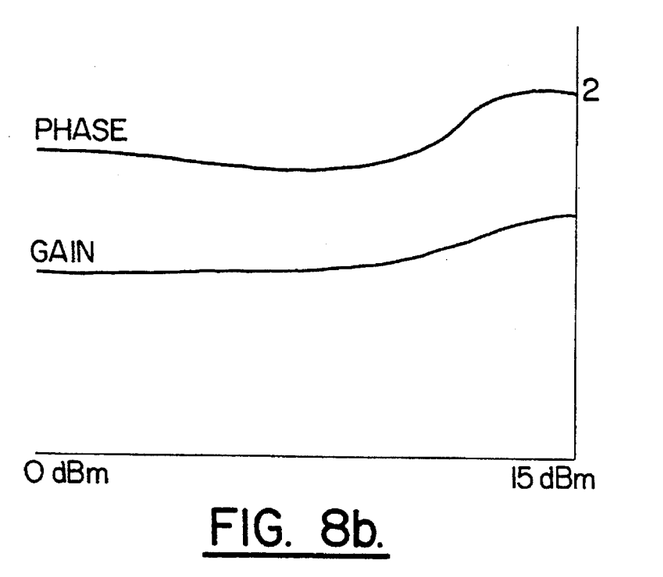

FIGS. 8a and 8b show the changes in the characteristics which can be obtained by separately adjusting the drain voltage (VD1, VD2) and the gate voltage (VG1, VG2) of the transistors T1 and T2. In particular it is possible to obtain a phase delay or a phase advance while maintaining expansion in gain.

I claim:

1. A pre-distorting linearization circuit, comprising a splitter circuit with an input forming the input of the linearization circuit and first and second outputs feeding first and second parallel stages respectively, of which at least one has a defined distortion characteristic, and a combining circuit receiving the signals provided by the first and second stages at first and second inputs respectively and having a recombination output which forms the output of the linearization circuit, wherein the first and second stages have first and second transistors respectively having different dimensions, which confer different non-linearity characteristics thereon, such that for the same voltage on the input of the linearization circuit, the first stage exhibits a higher degree of non-linearity than the second stage.

2. A circuit according to claim 1, wherein the first and second transistors are field effect transistors having first and second gates respectively, whose widths are in a given ratio other than unity.

3. A circuit according to claim 2, wherein said field effect transistors are MESFETs.

4. A circuit according to claim 3, wherein each of the MESFETs has a gate bias terminal and a drain bias terminal.

5. A circuit according to claim 2, wherein the ratio between the widths of the gates of the second and first transistors lies in the range 2 to 10 and is preferably equal to 4.

6. A circuit according to claim 1, wherein the splitter circuit and the combining circuit have a nominal impedance of 100 Ω.

7. A circuit according to claim 6, wherein the splitter circuit and the combining circuit each have a series branch comprising in succession a first, a second, and a third capacitor in series, forming an output branch for the splitter circuit and an input branch for the combining circuit, a first inductor having a first terminal connected to a first terminal of the second capacitor, a second inductor having a first terminal connected to a second terminal of the second capacitor, a fourth capacitor connected between the second terminals of the first and the second inductor and a resistor connected between the second terminal of the second inductor and a voltage supply terminal, the second terminal of the first inductor forming an input terminal for the splitter circuit and an output terminal for the combining circuit.

8. A circuit according to claim 1, wherein the first stage has a phase-shifter.

9. A circuit according to claim 8, wherein the phase-shifter is a delay line.

10. A circuit according to claim 8, wherein the splitter circuit, the combining circuit, and the first and second stages are on a first MMIC technology substrate, while the delay line is on a second MIC technology substrate.

* * * * *